(12) United States Patent
Fautz

(10) Patent No.: US 9,279,872 B2
(45) Date of Patent: Mar. 8, 2016

(54) METHOD FOR DETERMINING A SET OF $B_1$ FIELD MAPS

(71) Applicant: Hans-Peter Fautz, Forchheim (DE)

(72) Inventor: Hans-Peter Fautz, Forchheim (DE)

(73) Assignee: Siemens Aktiengesellschaft, München (DE)

(*) Notice: Subject to any disclaimer, the term of this patent is extended or adjusted under 35 U.S.C. 154(b) by 488 days.

(21) Appl. No.: 13/784,816

(22) Filed: Mar. 4, 2013

(65) Prior Publication Data

US 2013/0229176 A1    Sep. 5, 2013

(30) Foreign Application Priority Data

Mar. 5, 2012   (DE) .................. 10 2012 203 453

(51) Int. Cl.
  *G01R 33/36*   (2006.01)
  *G01R 33/24*   (2006.01)
  *G01R 33/3415* (2006.01)

(52) U.S. Cl.
  CPC .............. *G01R 33/36* (2013.01); *G01R 33/246* (2013.01); *G01R 33/3415* (2013.01)

(58) Field of Classification Search
  CPC ... G01R 33/36; G01R 33/246; G01R 33/3415
  See application file for complete search history.

(56) References Cited

U.S. PATENT DOCUMENTS

| | | | |
|---|---|---|---|
| 6,268,728 B1 | 7/2001 | Morrell | |
| 6,989,673 B2 * | 1/2006 | Zhu .................... | G01R 33/5612 324/318 |
| 7,053,618 B2 * | 5/2006 | Zhu ..................... | G01R 33/288 324/309 |
| 7,075,301 B2 * | 7/2006 | Zhu .................... | G01R 33/5612 324/309 |
| 7,075,302 B2 * | 7/2006 | Zhu ..................... | G01R 33/288 324/309 |
| 7,349,729 B2 | 3/2008 | Reeder et al. | |
| 7,482,805 B2 | 1/2009 | Feiweier | |

(Continued)

FOREIGN PATENT DOCUMENTS

| | | |
|---|---|---|
| CN | 101711126 A | 5/2010 |
| CN | 101849194 A | 9/2010 |

(Continued)

OTHER PUBLICATIONS

German Office Action dated Jan. 31, 2013 for corresponding German Patent Application No. DE 10 2012 203 345.6 with English translation.

(Continued)

*Primary Examiner* — Dixomara Vargas
(74) *Attorney, Agent, or Firm* — Lempia Summerfield Katz LLC

(57) ABSTRACT

A method for determining a set of B1 field maps for different transmit channels includes determining a first partial B1 field map having absolute B1 amplitudes for each transmit channel. A gradient echo technique operating with a single gradient echo image is used to determine a relative partial B1 field map having relative B1 amplitudes for each transmit channel. A spatial weighting function for mapping the relative B1 amplitudes onto absolute B1 amplitudes is determined taking into account the first partial B1 field maps and the relative partial B1 field maps of all the transmit channels. The spatial weighting function is used to determine second partial B1 field maps from the relative partial B1 field maps. The B1 field map for each transmit channel is determined from the first and the second partial B1 field map for the respective transmit channel taking into account the subregions and/or the error values.

18 Claims, 3 Drawing Sheets

(56) References Cited

U.S. PATENT DOCUMENTS

| | | | | |
|---|---|---|---|---|
| 8,643,675 | B2* | 2/2014 | Mlejnek | G06T 7/0012 |
| | | | | 345/632 |
| 8,754,644 | B2* | 6/2014 | Trakic | G01R 33/422 |
| | | | | 324/307 |
| 2005/0085713 | A1 | 4/2005 | Reeder et al. | |
| 2010/0164495 | A1 | 7/2010 | Takizawa et al. | |
| 2010/0240984 | A1 | 9/2010 | Fuderer | |
| 2011/0025327 | A1 | 2/2011 | Deoni et al. | |

FOREIGN PATENT DOCUMENTS

| | | |
|---|---|---|
| DE | 10 2005 049 229 B3 | 5/2007 |
| WO | WO2008037994 A1 | 4/2008 |

OTHER PUBLICATIONS

Van de Moortele, P., et al., "Calibration Tools for RF Shim at Very High Field with Multiple Element RF Coils: From Ultra Fast Local Relative Phase to Absolute Magnitude B1+ Mapping," Proc. Intl. Sol. Mag. Reson. Med., No. 15, pp. 1676 (2007).

Funai, A., et al., "Regularized Field Map Estimation in MRI," IEEE Trans. Med. Imaging, vol. 27, No. 10, pp. 1484-1494 (2008).

Chinese Office Action for Chinese Patent Application No. 201310068632.7, mailed Oct. 10, 2015 with English Translation.

* cited by examiner

METHOD FOR DETERMINING A SET OF $B_1$ FIELD MAPS

This application claims the benefit of DE 10 2012 203 453.6, filed on Mar. 5, 2012, which is hereby incorporated by reference.

BACKGROUND

The present embodiments relate to a method for determining a set of $B_1$ field maps for different transmit channels of a radio-frequency transmit coil of a magnetic resonance apparatus.

Magnetic resonance imaging and the basic principles thereof are already widely known in the prior art. The process entails introducing an object that is to be examined into a relatively high basic magnetic field (e.g., the $B_0$ field). In order to be able to acquire magnetic resonance data, in a slice, for example, the spins of the slice are excited, and the decay of the excitation, for example, is considered as a signal. A gradient coil arrangement may be used to generate gradient fields, while high-frequency excitation pulses (e.g., radio-frequency pulses) are transmitted via a radio-frequency transmit coil. A radio-frequency field (e.g., a $B_1$ field) is generated by the radio-frequency pulses, and the spins of resonantly excited nuclei, spatially resolved by the gradients, are tilted through a flip angle relative to the magnetic field lines of the basic magnetic field. The excited spins of the nuclei then emit radio-frequency signals that may be picked up by suitable receive antennas and processed further in order thus to enable magnetic resonance image data to be reconstructed.

Conventional radio-frequency transmit coils are operated in a "homogeneous mode" (e.g., in a "CP mode"). A single radio-frequency pulse having a defined fixed phase and amplitude is applied to all the components of the transmit coil (e.g., all the transmit rods of a birdcage antenna). In the interests of increasing flexibility and creating new degrees of freedom with the aim of improving the imaging, a technique known as parallel transmission, in which individual pulses that may be different from one another are applied to each of a plurality of transmit channels, is enabled. This totality of individual pulses, which may be described, for example, via the parameters phase and amplitude, is defined in entirety in an activation sequence that is described by a corresponding parameter set. Such a multichannel pulse that is composed of individual pulses for the different transmit channels may be referred to as a "pTX pulse" (e.g., "parallel transmission"). In addition to the generation of location-selective excitations, field inhomogeneities may also be compensated in the process (e.g., as part of "RF shimming").

In order to determine an activation parameter set of an activation sequence, the effects of the individual transmit channels in the imaging region (e.g., the homogeneity volume) are to be known. These are determined using a technique called "B1 mapping." In B1 mapping, B1 field maps are acquired for each transmit channel, which provides that the B1 field maps reveal how strong the B1 field is at a specific excitation (e.g., at a unit excitation and/or at a specific transmitter voltage), at a specific location in the imaging region. This provides that each voxel (e.g., volumetric picture element) is assigned a mostly complex B1 value and consequently a B1 amplitude and a B1 phase. The B1 field maps are strongly object-dependent (e.g., at field strengths of the basic magnetic field such as $\geq 3$ T), so that the B1 field maps are acquired individually for each object that is to be scanned. B1 mapping scans may take a very long time in comparison with conventional imaging methods.

Known B1 mapping methods may measure the flip angle caused by a radio-frequency pulse and a phase. The amplitude of the B1 field may easily be determined from the flip angle. The problem here is that all B1 mapping methods have only a limited sensitivity range insofar as the flip angle as a measurement parameter is concerned. The sensitivity range is mostly specified as a region in which the measurement parameter (e.g., the flip angle) may be reliably measured. The sensitivity range is composed of intrinsic limitations inherent in the measurement methods and/or the acquisition technique. Such a limitation in the case of B1 mapping methods may be the fact that only flip angles between 0° and 180° may be resolved, and regions in which an excessively high level of uncertainty and consequently an excessively high error value is present. High error values are produced, for example, as a result of signal noise, such that, for example, in the acquisition techniques used in the B1 mapping method, very small flip angles may be detected only with very great difficulty on account of the signal noise.

Thus, it is known, for example, that signal noise may lead to a systematic overestimation of very small flip angles.

For example, for systems having a plurality of local transmitters, the B1 variation over the object that is to be scanned may be very great. This provides that the transmitter voltage used, a parameter that may be used in selecting the sensitivity range, may not be chosen such that the generated flip angle lies over the object that is to be imaged within the sensitivity range of a scan acquired using the B1 mapping method.

With regard to this problem (e.g., when the dynamic range of the B1 field distribution over the object that is to be imaged is greater than the sensitivity range of the B1 mapping method used), two basic approaches to a solution are known.

It has been proposed to reduce the dynamic ranges of B1 field distributions that are to be acquired. This may be achieved by measuring, not the field distributions of the individual channels and consequently the individual coil elements, but the field distributions of different channel and therefore coil element combinations. The field distributions of the individual channels are to be unequivocally calculated from the measurement results for the transmit channel combinations, ideally with reduced noise sensitivity in comparison with the measurement of the individual transmit channels in each case. The result is therefore a complex backward calculation from a plurality of combinations that are highly susceptible to error and computationally intensive. A greater number of individual B1 field distributions may thus be measured.

In another solution, it has been proposed to cover the dynamic range of the B1 field distributions sequentially in a plurality of measurements. This provides that a plurality of B1 measurements are performed repeatedly for each transmit channel at a different transmitter voltage, the different transmitter voltages generating B1 fields of different strength. A B1 field that falls within the sensitivity range of the B1 mapping method used is to be generated at least once for each subvolume of the imaging region. In this case, therefore, the results of a plurality of measurements using the same acquisition technique, but at different transmitter voltages, are combined in order to obtain the B1 field maps. There is an obvious increase in the measurement and evaluation overhead. The transmitter voltage may also only be varied within certain limits, with the result that no improvement is achieved in relation to the basic problem (e.g., the high signal noise at low flip angles).

Absolute values (or absolute values normalized to a specific transmitter voltage value and a specific excitation) of the B1 field are used for planning the acquisition session and for determining activation parameter sets for activation sequences. Accordingly, although acquisition techniques in which relative B1 field maps may be generated are known, these have the disadvantage that the acquisition techniques do not directly specify the B1 field in terms of the amplitude, but are weighted with a spatial function. The term "relative" in this context refers to the cited weighting function, unknown within the framework of these measurements, which may correspond, for example, to the root of the sum of squares of the amplitudes over all transmit channels. The basic principle of such relative measurement methods is explained in more detail, for example, in DE 10 2005 049 229 B3.

In order to determine the spatial weighting function, reliable B1 field values are to be available at the same picture element both for the absolute B1 amplitude and for the relative B1 amplitude. One possibility of back-calculating the absolute B1 values from relative B1 values is described, for example, in the article titled "Calibration Tools for RF Shim at Very High Field with Multiple Element RF Coils: from Ultra Fast Local Relative Phase to Absolute Magnitude B1+Mapping" by P. F. Van de Moortele et al., Proc. Intl. Soc. Mag. Reson. Med. 15 (2007) 1676. There, it is proposed to perform a further absolute B1 measurement while using all of the transmit channels in order then to be able to solve a linear equation system. Problems of the sensitivity ranges are not addressed therein, however.

SUMMARY AND DESCRIPTION

The present embodiments may obviate one or more of the drawbacks or limitations in the related art. For example, an improved method for determining B1 field maps in the case of a radio-frequency transmit coil having a plurality of transmit channels is provided.

A method includes determining a first partial B1 field map having absolute B1 amplitudes for each transmit channel using a first acquisition technique. An error value assigned to the B1 amplitudes of the first partial B1 field map undershoots a predetermined limit value in a first subregion of the measurement parameter space. A gradient echo technique operating with a single gradient echo image is used to determine a relative partial B1 field map having relative B1 amplitudes for each transmit channel. A spatial weighting function for mapping the relative B1 amplitudes onto absolute B1 amplitudes is determined taking into account the first partial B1 field maps and the relative partial B1 field maps of all the transmit channels. The weighting function is used to determine second partial B1 field maps from the relative partial B1 field maps. An error value assigned to the B1 amplitudes of the second partial B1 field map in a second subregion of the measurement parameter space lying at lower measurement parameter values than the first subregion undershoots the predetermined limit value. The first and the second subregion immediately adjoin each other or overlap. The B1 field map for each transmit channel is determined from the first and the second partial B1 field map for the respective transmit channel taking into account the subregions and/or the error values.

The information derived from relative B1 field maps in the problematic low flip angle regions is used since the flip angle is the measurement parameter that may used for measuring the B1 fields. With relative B1 field maps acquired using the gradient echo technique, accurate measurements with respect to the signal-to-noise ratio (SNR) may be provided at, for example, low flip angles, which is complementary to the acquisition techniques that may used in B1 mapping methods, and consequently also to the acquisition techniques that are employed for the first partial B1 field maps. The measurement results obtained from the gradient echo images therefore supplement the definitive B1 field maps that are to be produced at the points at which a measurement using the first acquisition technique would be too inaccurate.

A plurality of value pairs, each having a relative B1 amplitude and an absolute B1 amplitude, are present in the case of measurements at a plurality of transmit channels for each picture element in the imaging region. Accordingly, the spatial weighting function may still be determined with sufficient accuracy, even in the case of inaccuracies of one of the acquisition techniques being present, in order to be able to back-calculate the relative B1 amplitudes onto absolute B1 amplitudes and thus deliver quantitative B1 amplitudes at low flip angles. This goes beyond an approach in which any acquisition techniques used for prior art B1 mapping methods that yield absolute B1 amplitudes are combined (e.g., because these exhibit fundamental problems at low flip angles).

The different partial B1 field maps and also the relative and the absolute B1 amplitudes are normalized and/or calibrated to the same signal shape and the same transmitter voltage. This provides that all the field maps described may be present, for example, in units of B1/transmitter voltage [T/V].

In the method, first measurement data (e.g., flip angles) is therefore acquired initially, an acquisition technique for B1 mapping methods being used such that a first partial B1 field map with absolute B1 amplitudes is obtained for each transmit channel. Not all B1 amplitudes of this first partial B1 field map are reliable, since deviations that are described by an error value may occur, for example, due to the signal noise at small flip angles and under certain conditions also due to the signal noise at flip angles close to 180°. This error value is also used in order to specify the first subregion of the measurement parameter space and consequently the flip angle, in which the measurement values are sufficiently reliable in that a predetermined limit value that the error value is to undershoot is used. The first subregion therefore corresponds to a sensitivity range for the first acquisition technique.

A relative partial B1 field map for each transmit channel is determined using the gradient echo technique and a single gradient echo image. Even if the gradient echo measurement method has a higher sensitivity in relation to the SNR at low flip angles, the values may not be used directly in order to supplement the B1 amplitudes outside of the first subregion due to the relative character of the B1 amplitudes that are modulated by the initially unknown spatial weighting function.

The spatial weighting function, which may include a proportionality factor between relative B1 amplitude and absolute B1 amplitude for each picture element considered in the field maps, is determined. This is possible because not just a single, possibly unreliable, value pair is present at each picture element, but one value pair is present for each channel, such that the spatial weighting function may be determined taking into account the first partial B1 field maps. Second partial B1 field maps are therefore produced using the weighting function. The second partial B1 field maps include a second subregion defined like the first subregion and lying, for example, at low flip angles according to the nature of the gradient echo acquisitions. Once again, therefore, error values resulting for the B1 values of the second partial B1 field map are compared with the predetermined limit value in order to determine the second subregion. The data to be considered in the following may essentially be chosen such that the first and the second subregion adjoin each other or even overlap such that the provided sensitivity range is also actually covered by the first subregion and the second subregion. Therefore, the sensitivity range of the first acquisition technique described by the first subregion is extended in that recourse is made in addition to the gradient echo technique.

Given knowledge of the subregions in which the B1 amplitudes of the first and the second partial B1 field maps are reliable, a complete, definitive B1 field map may be determined herefrom for each transmit channel.

An extended sensitivity is obtained from an arbitrary set of first partial B1 field maps and a set of gradient echo images. With regard to the noise, relative B1 field maps have a particularly high sensitivity for small flip angles, where the sensitivity for the larger flip angles is limited. The method is thus complementary to most of the known B1 mapping methods that may have a large sensitivity range between flip angles of 20° and 160°, while the sensitivity to small flip angles is limited. Relative B1 field maps may be acquired very quickly and are robust against artifacts.

In a further embodiment, the B1 amplitudes of the partial B1 field map in which subregion the B1 amplitudes lie are used in each case in order to determine the B1 field map. The fact whether the B1 amplitude comes from a sensitivity range of an acquisition technique determines whether the B1 amplitude gains entry into the definitive B1 field map. Where first and second subregions overlap, the B1 amplitude having the better assigned error value is used in the overlap zone for determining the B1 field map. Alternatively, an average value is formed (e.g., weighted on the basis of the error values). The final B1 field map is therefore determined from the available partial B1 field maps such that each picture element is assigned the value from that partial B1 field map having a sensitivity range (subregion) that covers the value. If the subregions overlap, the better value may be used, or the final B1 amplitude may also be formed from different partial B1 field maps as a weighted average value.

Value pairs are determined for all transmit channels for the purpose of determining the spatial weighting function for each picture element of the relative partial B1 maps and the first partial B1 maps. A proportionality factor linking the relative B1 amplitude with the absolute B1 amplitude at the picture element is determined from the value pairs. The weighting function is therefore described as proportionality factors assigned to picture elements, as the spatial weighting function is the same for all transmit channels. As a result, the information of different transmit channels may be used in order to determine the proportionality factor with maximum precision.

In an embodiment, in order to determine the proportionality factor, a fit and/or an average value may be formed (e.g., taking into account error values of the respective B1 amplitudes of the value pairs). All the amplitudes according to error values, which may also be incorporated into a fit of a straight line running through 0, may be considered (e.g., weighted).

In one embodiment, in the case of a non-phase-sensitive first acquisition technique, phase information assigned to the B1 amplitudes of the B1 map is determined from the gradient echo images on which the relative partial B1 maps are based. A plurality of B1 mapping methods are known in which the first acquisition technique used yields only the amplitude of the B1 fields but no phase, although the phase may be used. Gradient echo images that yield relative B1 amplitudes also yield the phase of the B1 fields, so the corresponding phase information may be derived therefrom, and consequently, complex B1 values including the phase and the amplitude will be present in the definitive B1 maps. According to one embodiment, therefore, the gradient echo technique is used not only to obtain phase information relating to B1 values, but also to supplement the B1 amplitudes of the first acquisition technique with further B1 amplitudes having a smaller error at low flip angles. In cases in which gradient echo images are therefore already acquired in order to obtain the phase information, when the method is used, no additional measurement overhead is used in order to extend the sensitivity range starting from the first acquisition technique and consequently to enhance the overall quality of the B1 field maps determined for the different transmit channels.

The method may be realized in a magnetic resonance apparatus. For example, a magnetic resonance apparatus may have a control device that is embodied for performing the method such that the improved B1 field map determination may also be carried out in an automated manner directly on the magnetic resonance apparatus.

DETAILED DESCRIPTION OF THE DRAWINGS

Figure 1:
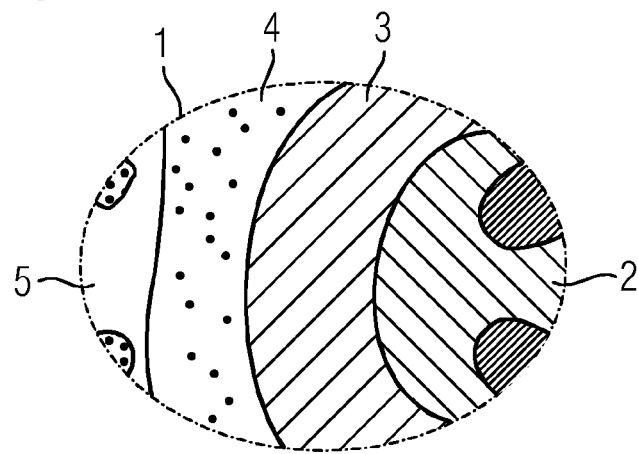
FIG. 1 shows an exemplary B1 field distribution for a transmit channel of a radio-frequency transmit coil in an imaging region.

FIG. 1 shows an exemplary B1 field distribution in an imaging region 1 for a single transmit channel of a radio-frequency transmit coil of a magnetic resonance apparatus that may be addressed via a plurality of transmit channels. The hatched areas in FIG. 1 correspond to certain regions within which an amplitude of the B1 field lies at a time of an excitation. A region 2 represents a region of highest B1 amplitudes, where regions 3, 4 and 5 follow at low amplitudes.

In order to determine a B1 field map in the imaging region 1, which may be three-dimensional and, for the purposes of the B1 field map, is subdivided into picture elements (voxels), a maximally accurate measurement of the B1 amplitudes that are derivable as measurement parameters from the flip angle is to be provided. After the B1 mapping, measurement values may be present for the flip angle and consequently the B1 amplitudes having an assigned error value that undershoots a predefined limit value (e.g., tolerance value). The aim, therefore, is to determine B1 field maps that are as reliable as possible.

Figure 2:
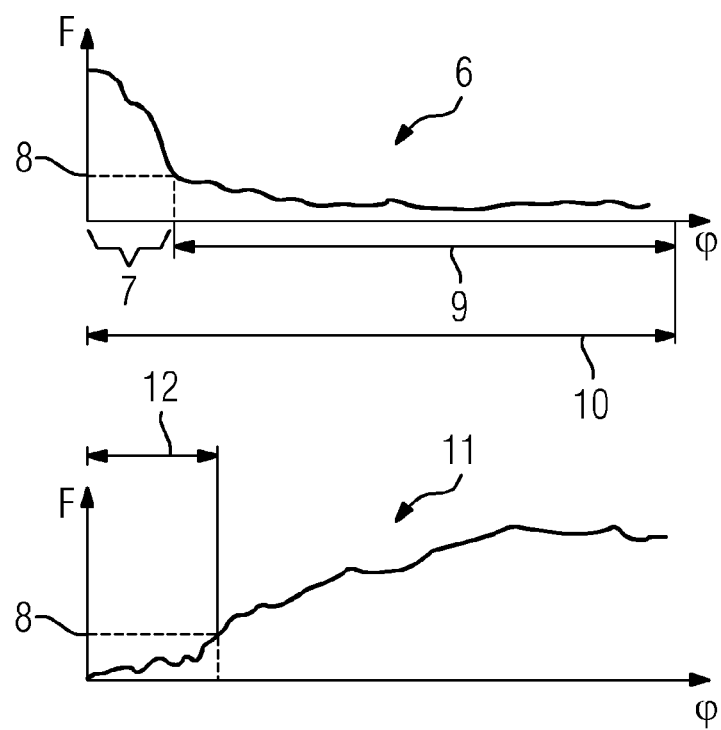
FIG. 2 shows an exemplary sensitivity range that is to be covered and exemplary subregions for acquisition techniques used in one embodiment of the method.

FIG. 2 shows the problem of known B1 mapping methods and illustrates the solution according to the present embodiments. In a graph 6 in the top part of FIG. 2, an error value F is plotted against a measured flip angle j. A high degree of uncertainty is present due to a signal noise in a region of small flip angles. This provides that a limit value 8 for an error value is exceeded in a subregion 7. This results in a specific sensitivity range of the B1 mapping method, which is shown as the first subregion 9 under the graph 6. In the illustrative example, however, a desired sensitivity range 10 results, for example, owing to the different B1 amplitudes according to FIG. 1. This also extends to the small flip angles, such that the first subregion 9 is significantly smaller than the desired sensitivity range 10.

In one embodiment, a further acquisition technique in which (cf., graph 11) a higher level of precision in relation to the noise is given at low flip angles is used. The second acquisition technique has, as a sensitivity range with regard to the derivable B1 amplitudes, a second subregion 12 that is supplemented overlapping with the first subregion 9 such that the entire desired sensitivity range 10 (e.g., corresponding to the dynamic range of the B1 values) is covered by data.

As the second acquisition technique, a gradient echo technique that uses only one gradient echo image and initially delivers only relative B1 field maps, consequently relative B1 amplitudes, which are associated with absolute B1 amplitudes via a spatial weighting function that basically is initially unknown is used. However, this problem is solved in the method by determining, from the relative partial B1 field maps obtained using the gradient echo technique, partial B1 field maps that contain absolute B1 values for the B1 amplitude.

Figure 3:
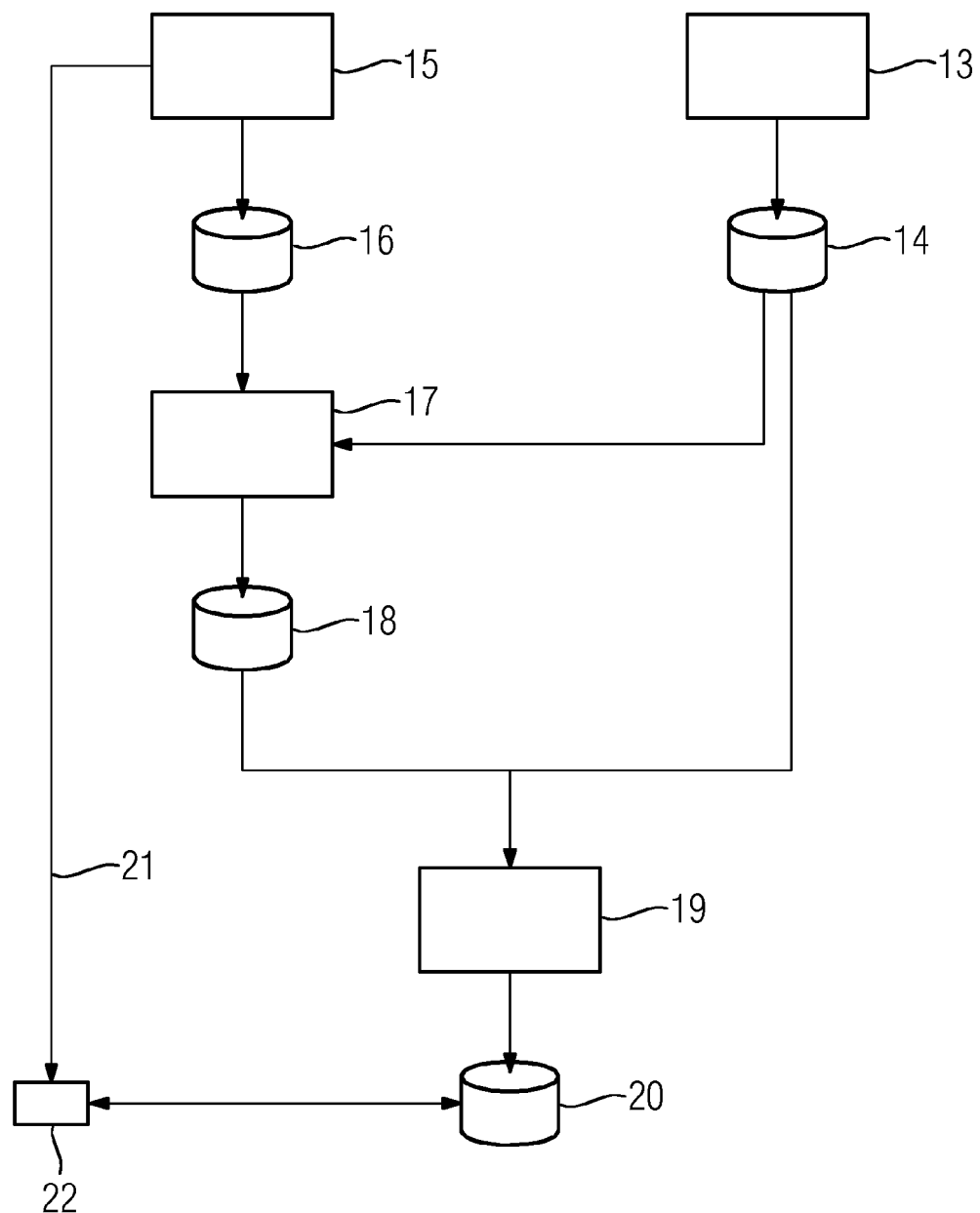
FIG. 3 shows a flowchart of one embodiment of the method.

This is explained in more detail using the flowchart in FIG. 3. As in a normally used B1 mapping method, measurement data with respect to the flip angle is acquired in act 13 using a first acquisition technique for each transmit channel from which first partial B1 field maps 14 may be determined in the known manner. The first partial B1 field maps 14 are not used already as definitive field maps in which in the region of low flip angles and consequently low B1 amplitudes, there would be inaccuracies, but instead further data is used in order to obtain reliable B1 amplitudes over the entire desired sensitivity range 10. For this purpose, in act 15, measurement data is also acquired using the gradient echo technique, and relative partial B1 field maps 16 are determined for all transmit channels in the known manner. In act 17, with the aid of the first partial B1 field maps 14, the spatial weighting function that enables the relative partial B1 field maps 16 to be used as a basis for determining second partial B1 field maps 18 that contain absolute B1 amplitudes corresponding to the same excitations and transmitter voltages as the B1 amplitudes of the first partial B1 field maps 14 is determined. This results in a merging operation that may be performed in act 19.

The spatial weighting function may be determined in act 17 in a more reliable manner since for each transmit channel there exists a value pair consisting of relative B1 amplitude and absolute B1 amplitude (from the first partial B1 field maps 14) for each picture element. The corresponding B1 amplitudes lie in the most disparate value ranges, since multichannel radio-frequency transmit antennas may be configured such that the transmit channels exhibit the strongest excitations at different locations in the imaging region 1. The result may be not just a number of value pairs corresponding to the number of transmit channels, but the value pairs are also measured from the most disparate ranges.

Since it is known that the relative and the absolute B1 amplitude are related by a proportionality factor that, though different for each picture element, is independent of the transmit channels, using a fit or an averaging function (e.g., a weighted averaging function), a value for the proportionality factor may be determined. In addition, for example, in the weighting, the error values assigned in each case to the B1 amplitudes and ultimately describing the measurement error may be taken into account.

Once the spatial weighting function has been determined in this way, the second partial B1 field maps 18 are also determined in act 17 at the same time.

In act 19, the B1 field maps 20 are determined from the first and second partial B1 field maps 14, 18 for each transmit channel. This happens on the basis of the subregions 9 and 12. If a B1 amplitude (or the assigned flip angle) lies in the subregion 9 but not in the subregion 12, then the B1 amplitude of the first partial B1 field map 14 is used for the B1 field map 19. This applies analogously if a B1 amplitude lies in the subregion 12, but not in the subregion 9. A weighted average value is formed in the overlap zone (or also when the respective B1 amplitudes lie in the respective subregions, as the respective B1 amplitudes may have been measured fundamentally differently). The error value is factored into the weighting in each case. A weighted average value formed in this way is used at the corresponding picture element in the B1 field map 20.

In the exemplary embodiment illustrated, no phase information may be recorded by the first acquisition technique used in act 13, which provides that initially only information relating to the amplitude of the B1 field is present. However, the gradient echo technique also permits phase information to be acquired in addition to the relative B1 amplitudes, with the result that the phase information assigned to the B1 amplitudes may also be deduced from the gradient echo images acquired using the gradient echo technique (cf., the arrow 21 and the phase information 22).

Figure 4:
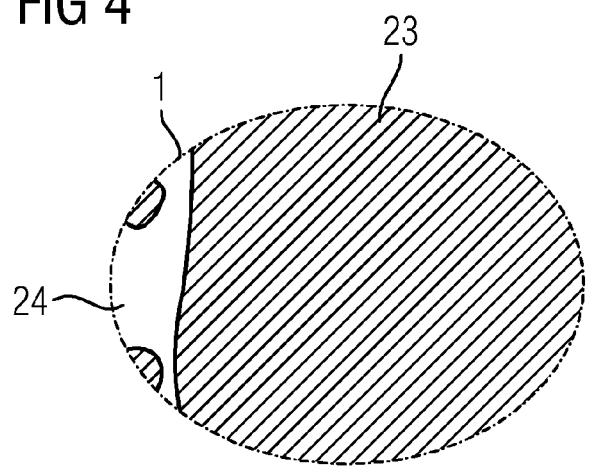
FIG. 4 shows an exemplary combination of partial B1 field maps to form a definitive B1 field map.

The combination of the partial B1 field maps 14, 18 taking place in act 19 is schematically represented in FIG. 4. If the imaging region 1 is considered again (the overlap zone not being shown for the sake of simplicity), in the B1 field map 20, a first region 23 is filled with the B1 amplitudes of the first partial B1 field maps 14, and a second region 24 is filled with the B1 amplitudes of the second partial B1 field maps 18. The B1 field maps 20 therefore contain the B1 values including the amplitude and the phase.

Figure 5:
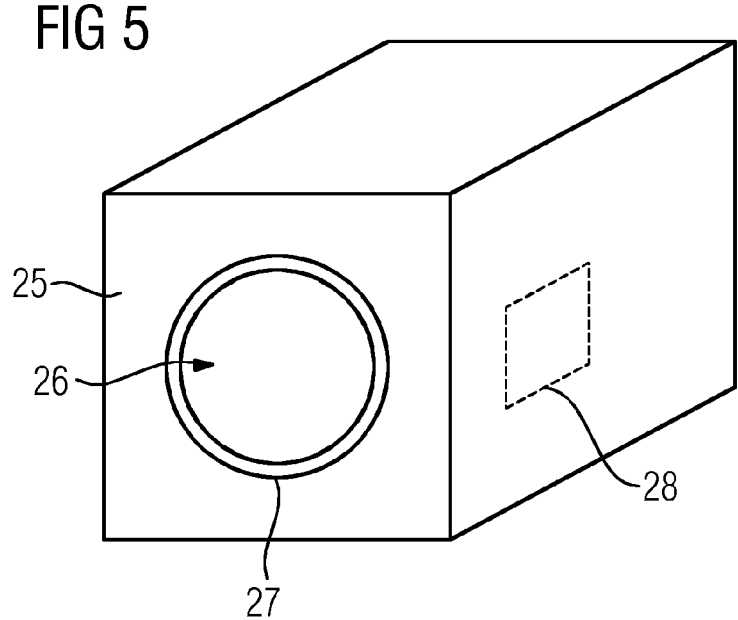
FIG. 5 shows one embodiment of a magnetic resonance apparatus for performing a method.

FIG. 5 shows a schematic diagram of one embodiment of a magnetic resonance apparatus 25 that may be used for performing the method. The magnetic resonance apparatus 25 has a patient receiving bore 26 that, for example, is provided circumferentially with a multichannel radio-frequency transmit coil 27 (e.g., a birdcage coil) having eight transmit channels.

The operation of the magnetic resonance apparatus 25 is controlled by a control device 28 that is also embodied for performing the method. The control device 28 may determine the B1 field maps for the different transmit channels for a specific object that is to be imaged and may evaluate the maps further for the purpose of determining suitable activation parameters.

Although the invention has been illustrated and described in detail on the basis of embodiments, the invention is not limited by the examples disclosed. Other variations may be derived by the person skilled in the art without departing from the scope of protection of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for determining a set of B1 field maps for different transmit channels of a radio-frequency transmit coil of a magnetic resonance apparatus, the method comprising:
    determining a first partial B1 field map having absolute B1 amplitudes for each of the different transmit channels, the determining of the first partial B1 field map comprising using a first acquisition technique, wherein an error value assigned to the absolute B1 amplitudes of the first partial B1 field map undershoots a predetermined limit value in a first subregion of a measurement parameter space;

determining a relative partial B1 field map having relative B1 amplitudes for each of the different transmit channels, the determining of the relative partial B1 field map comprising using a gradient echo technique operating with a single gradient echo image;

determining a spatial weighting function for mapping the relative B1 amplitudes onto the absolute B1 amplitudes taking into account the first partial B1 field maps and the relative partial B1 field maps of the different transmit channels;

determining second partial B1 field maps from the relative partial B1 field maps, the determining comprising using the spatial weighting function, wherein an error value assigned to B1 amplitudes of the second partial B1 field map in a second subregion of the measurement parameter space lying at lower measurement parameter values than the first subregion undershoots the predetermined limit value, and wherein the first subregion and the second subregion immediately adjoin each other or overlap;

determining the B1 field map for each of the different transmit channels from the first partial B1 field map and the second partial B1 field map for the respective transmit channel taking into account the first subregion and the second subregion, the error values, or the first subregion and the second subregion and the error values.

2. The method as claimed in claim 1, wherein the B1 amplitudes of the partial B1 field map in which subregion the B1 amplitudes lie are used in each case for determining the B1 field map.

3. The method as claimed in claim 2, wherein with the first subregion and the second subregion overlapping, the B1 amplitude having a first relative assigned error value in an overlap zone is used for determining the B1 field map, or an average value is formed.

4. The method as claimed in claim 3, wherein the average value is formed using weighting on the basis of the error values.

5. The method as claimed in claim 1, further comprising determining value pairs for all of the different transmit channels in order to determine the spatial weighting function for each picture element of the relative partial B1 field maps and the first partial B1 maps, a proportionality factor linking the relative B1 amplitude with the absolute B1 amplitude at the picture element being determined from the value pairs.

6. The method as claimed in claim 5, further comprising determining the proportionality function, the determining of the proportionality function comprising forming a fit, an average value, or the fit and the average value.

7. The method as claimed in claim 6, wherein the determining of the proportionality function comprises taking into account error values of the respective B1 amplitudes of the value pairs.

8. The method as claimed in claim 1, further comprising determining phase information assigned to the B1 amplitudes of the B1 map from gradient echo images on which the relative partial B1 maps are based.

9. The method as claimed in claim 8, wherein the phase information is determined in the case of a non-phase-sensitive first acquisition technique.

10. The method as claimed in claim 2, further comprising determining value pairs for all of the different transmit channels in order to determine the spatial weighting function for each picture element of the relative partial B1 field maps and the first partial B1 maps, a proportionality factor linking the relative B1 amplitude with the absolute B1 amplitude at the picture element being determined from the value pairs.

11. The method as claimed in claim 3, further comprising determining value pairs for all of the different transmit channels in order to determine the spatial weighting function for each picture element of the relative partial B1 field maps and the first partial B1 maps, a proportionality factor linking the relative B1 amplitude with the absolute B1 amplitude at the picture element being determined from the value pairs.

12. The method as claimed in claim 4, further comprising determining value pairs for all of the different transmit channels in order to determine the spatial weighting function for each picture element of the relative partial B1 field maps and the first partial B1 maps, a proportionality factor linking the relative B1 amplitude with the absolute B1 amplitude at the picture element being determined from the value pairs.

13. The method as claimed in claim 2, further comprising determining phase information assigned to the B1 amplitudes of the B1 map from gradient echo images on which the relative partial B1 maps are based.

14. The method as claimed in claim 3, further comprising determining phase information assigned to the B1 amplitudes of the B1 map from gradient echo images on which the relative partial B1 maps are based.

15. The method as claimed in claim 4, further comprising determining phase information assigned to the B1 amplitudes of the B1 map from gradient echo images on which the relative partial B1 maps are based.

16. The method as claimed in claim 5, further comprising determining phase information assigned to the B1 amplitudes of the B1 map from gradient echo images on which the relative partial B1 maps are based.

17. The method as claimed in claim 6, further comprising determining phase information assigned to the B1 amplitudes of the B1 map from gradient echo images on which the relative partial B1 maps are based.

18. The method as claimed in claim 7, further comprising determining phase information assigned to the B1 amplitudes of the B1 map from gradient echo images on which the relative partial B1 maps are based.

* * * * *